(12) United States Patent
Barkow et al.

(10) Patent No.: US 12,200,916 B2
(45) Date of Patent: Jan. 14, 2025

(54) LIQUID-COOLED POWER ELECTRONICS UNIT

(71) Applicants: Dr. Ing. h.c. F. Porsche Aktiengesellschaft, Stuttgart (DE); Fraunhofer-Gesellschaft zur Foerderung der angewandten Forschung e. V., Munich (DE)

(72) Inventors: Maximilian Barkow, Stuttgart (DE); Patrick Fuchs, Leonberg (DE); Timijan Velic, Weissach (DE); Bernd Eckardt, Erlangen (DE); Maximilian Hofmann, Erlangen (DE); Hubert Rauh, Erlangen (DE); Andre Mueller, Erlangen (DE); Benjamin Bayer, Erlangen (DE); Jordan Sorge, Erlangen (DE)

(73) Assignees: DR. ING. H.C. F. PORSCHE AKTIENGESELLSCHAFT, Stuttgart (DE); FRAUNHOFER-GESELLSCHAFT ZUR FOERDERUNG DEN ANGEWANDTEN FORSCHUNG E. V., Munich (DE)

( * ) Notice: Subject to any disclaimer, the term of this patent is extended or adjusted under 35 U.S.C. 154(b) by 156 days.

(21) Appl. No.: 18/058,277

(22) Filed: Nov. 23, 2022

(65) Prior Publication Data
US 2023/0164963 A1    May 25, 2023

(30) Foreign Application Priority Data
Nov. 25, 2021    (DE) .......................... 102021130926.3

(51) Int. Cl.
*H05K 7/20*    (2006.01)
*H05K 1/02*    (2006.01)

(52) U.S. Cl.
CPC ....... *H05K 7/20927* (2013.01); *H05K 1/0209* (2013.01)

(58) Field of Classification Search
CPC .......... H05K 7/20236; H05K 7/20254; H05K 7/20263; H05K 7/20272; H05K 7/203;
(Continued)

(56) References Cited

U.S. PATENT DOCUMENTS

2006/0090881 A1* 5/2006 Tuma .................... H01L 23/427
257/E23.095
2007/0290311 A1* 12/2007 Hauenstein ......... H01L 23/3735
257/E23.098
(Continued)

FOREIGN PATENT DOCUMENTS

DE    102007050417 A1    7/2008

*Primary Examiner* — Amir A Jalali
(74) *Attorney, Agent, or Firm* — LEYDIG, VOIT & MAYER, LTD.

(57) ABSTRACT

A liquid-cooled power electronics unit includes a planar circuit board body having conductor tracks, a wet side with a wet space for carrying a dielectric cooling liquid, and a fluidically, separated dry side, wherein at least two high-voltage power semiconductors are arranged on the circuit board body on the wet side within the wet space, the high-voltage power semiconductors being cooled by the cooling liquid, and an electronic low-voltage circuit is arranged on the dry side of the circuit board body.

5 Claims, 1 Drawing Sheet

(58) Field of Classification Search
CPC ........... H05K 7/20318; H05K 7/20327; H05K 7/20336; H05K 7/20381; H05K 7/20418; H05K 7/20445; H05K 7/20772; H05K 7/208; H05K 7/20809; H05K 7/20818; H05K 7/20836; H05K 7/20872–20881; H05K 7/20927–20936; H05K 5/00; H05K 5/061; H05K 1/0209; H01L 23/34; H01L 23/44; H01L 23/427; H01L 23/46; H01L 23/473; H03L 1/04
See application file for complete search history.

(56) References Cited

U.S. PATENT DOCUMENTS

| | | | |
|---|---|---|---|
| 2008/0101013 | A1 | 5/2008 | Nelson et al. |
| 2014/0355212 | A1* | 12/2014 | Campbell .......... H05K 7/20236 361/699 |
| 2015/0048675 | A1* | 2/2015 | Fujii .................... H05K 1/0203 307/10.1 |
| 2019/0274232 | A1* | 9/2019 | Tuttle ................... H01L 23/473 |
| 2020/0229303 | A1* | 7/2020 | Yeh ...................... H01L 21/4882 |
| 2020/0305310 | A1* | 9/2020 | Alissa ................... H05K 7/203 |
| 2023/0049108 | A1* | 2/2023 | Gao ....................... H05K 7/203 |
| 2023/0068585 | A1* | 3/2023 | Gao ....................... H05K 7/203 |
| 2023/0268332 | A1* | 8/2023 | Tang .................... H01L 23/427 257/675 |
| 2023/0292473 | A1* | 9/2023 | Sunaga .............. H05K 7/20236 |
| 2023/0308026 | A1* | 9/2023 | Byers ................. H05K 7/20336 |
| 2024/0114656 | A1* | 4/2024 | Weis .................. H05K 7/20272 |

\* cited by examiner

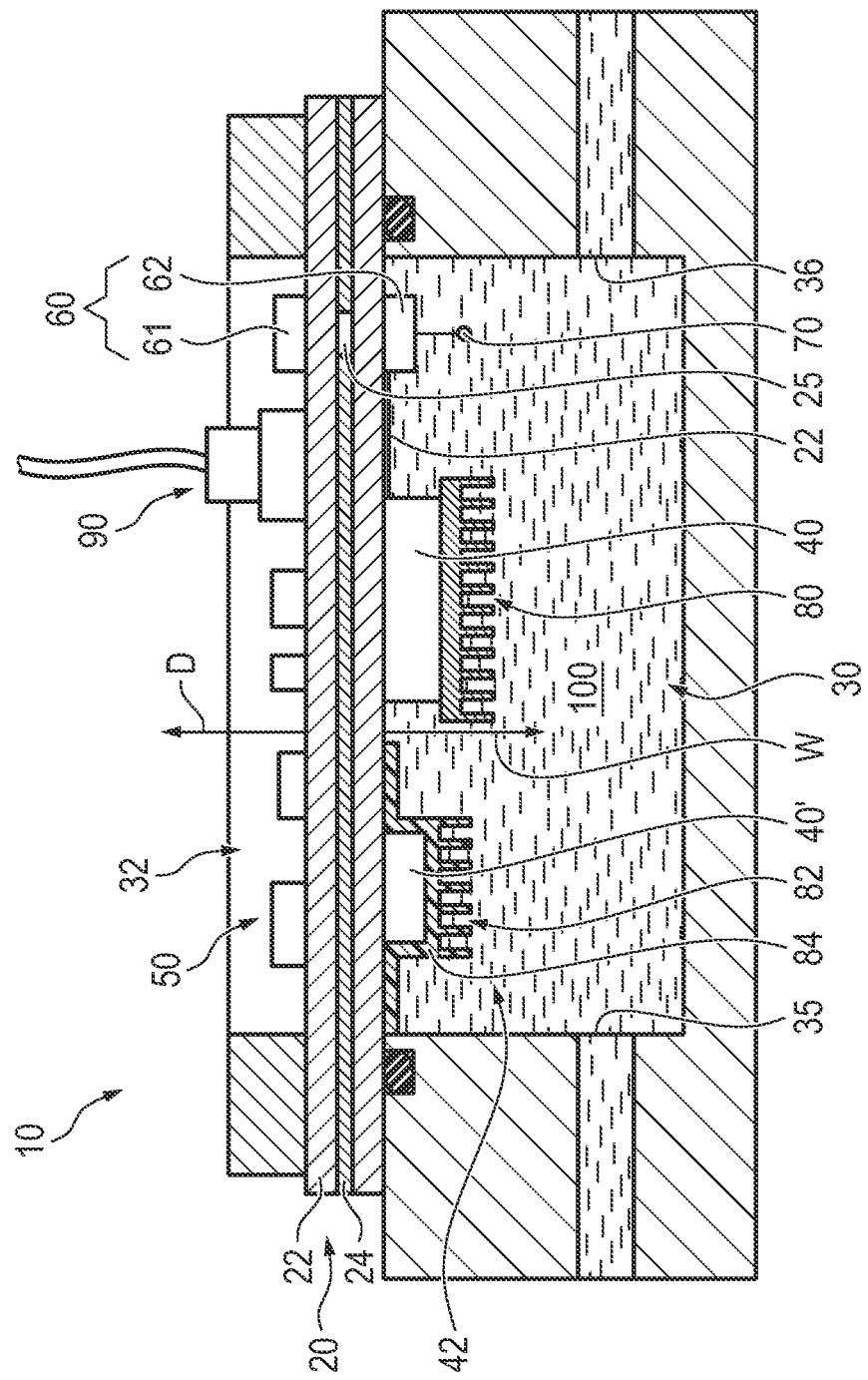

LIQUID-COOLED POWER ELECTRONICS UNIT

CROSS REFERENCE TO RELATED APPLICATIONS

This application claims benefit to German Patent Application No. DE 10 2021 130 926.3, filed on Nov. 25, 2021, which is hereby incorporated by reference herein.

FIELD

The invention relates to a liquid-cooled power electronics unit. The invention also relates to a power electronics unit of a motor vehicle with an electric traction drive.

BACKGROUND

Power electronics units are subject to high demands regarding the cooling and the galvanic separation of the high-voltage power semiconductors and a low-voltage circuit for controlling the power semiconductors. Liquid cooling of high-voltage power semiconductors is known from DE 10 2007 050 417 A1. However, in such an arrangement, the low-voltage circuit would have to be provided as a separate unit.

BRIEF DESCRIPTION OF THE DRAWING

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 1 illustrates a liquid-cooled power electronics unit according to an embodiment of the invention.

SUMMARY

In an embodiment, the present invention provides a liquid-cooled power electronics unit, comprising a planar circuit board body having conductor tracks, a wet side with a wet space for carrying a dielectric cooling liquid, and a fluidically separated dry side, wherein at least two high-voltage power semiconductors are arranged on the circuit board body on the wet side within the wet space, the high-voltage power semiconductors being cooled by the cooling liquid, and an electronic low-voltage circuit is arranged on the dry side of the circuit board body.

DETAILED DESCRIPTION

An aspect of the invention relates to a liquid-cooled power electronics unit with a plurality of high-voltage power semiconductors and with an electronic low-voltage circuit for actuating the high-voltage power semiconductors. An aspect relates to a power electronics unit of a motor vehicle with an electric traction drive, for example to a power electronics unit of a converter for the charging process of the traction battery or for the operation of the engine.

In an embodiment, the present invention provides a compact liquid-cooled power electronics unit with an integrated electronic low-voltage circuit which is galvanically separated from the power semiconductors.

The liquid-cooled power electronics unit according to an embodiment of the invention has a planar circuit board body having conductor tracks, wherein a wet side, on which a dielectric cooling liquid flows, and a dry side are fluidically separated from each other. The power electronics unit forms, on the wet side, a wet space through which the dielectric cooling liquid flows, wherein all the high-voltage power semiconductors or the entire high-voltage circuit are/is arranged on the wet side of the circuit board body or in the wet space. The high-voltage power semiconductors are electrically connected to each other by conductor tracks mounted on the circuit board body. All the high-voltage power semiconductors are preferably arranged in a single wet space. In contrast, the electronic low-voltage circuit is arranged on the dry side of the circuit board body and is therefore in this way fluidically isolated and separated from the wet side or from the high-voltage power section.

A low-voltage circuit in the present case is understood to mean a circuit which has voltages of at most 60 V. The high-voltage circuit operates with voltages of more than 60 V, in particular with voltages of several 100 V up to over 1000 V. The low-voltage circuit and the high-voltage circuit are therefore preferably galvanically separated from each other, wherein this separation is identical to the fluidic separation. Since the lm-voltage circuit controls the high-voltage power semiconductors, at least one potential-separating signal link for transmitting the control signals from the low-voltage circuit to the high-voltage power semiconductors is present between the low-voltage circuit and the high-voltage power semiconductors. The potential-separating signal link can be optical, capacitive and/or inductive.

In principle, the high-voltage power semiconductors and the high-voltage power section on the one hand and the low-voltage circuit on the other hand can be arranged next to each other on the same side of the planar circuit board body, wherein the fluidic separation between the high-voltage power section and the low-voltage circuit is formed by a separating wall placed fluid-tight on the circuit board body.

Particularly preferably, however, the planar circuit board body itself separates the wet space from the dry space such that the high-voltage power section with the high-voltage power semiconductors is arranged on one base surface of the circuit board body and the low-voltage circuit is arranged on the opposite base surface of the circuit board body. A very compact design of the whole power electronics unit can be realized in this way.

Preferably, a heat sink is mounted on the distal side of a high-voltage power semiconductor or of a plurality of high-voltage power semiconductors in each case, said heat sink improving the heat spreading and accordingly increasing the size of the effective heat-exchange surface area. The heat sink can be a metal heat sink but can also consist of a plastic potting material which encloses the power semiconductor in question. The heat sink can have fins or needles for increasing the size of its surface area.

Preferably, a metal plate is integrated into the plastic circuit board body, said metal plate extending over most of the base surface of the circuit board body and parallel to both base surfaces of the circuit board body. The metal plate is molded into the circuit board body in an electrically isolated manner. The metal plate firstly serves for better heat distribution or heat spreading and secondly serves in particular for the mechanical stabilization of the circuit board body, the wet side of which can be subjected to a certain overpressure of the dielectric cooling liquid. Preferably, the metal plate is a thick copper plate.

Preferably, a sensor for ascertaining a physical quantity of the dielectric cooling liquid is arranged on the wet side of the circuit board body, said sensor being connected to the low-voltage circuit so as to convey information to it. The sensor determines, for example, the temperature of the cooling liquid, its degree of contamination, its conductivity and/or its flow rate.

An exemplary embodiment of the invention is explained in more detail in the following text with reference to the drawing. The FIGURE schematically shows in longitudinal section a liquid-cooled power electronics unit with a planar circuit board body which fluidically and electrically separates the wet side that has a dielectric cooling liquid from the dry side on which an electronic low-voltage circuit is arranged.

The FIGURE schematically illustrates a liquid-cooled power electronics unit 10 which, for example, forms a converter in a motor vehicle with an electric traction drive. The power electronics unit 10 has a planar circuit board body 20 which is fitted with a plurality of electronic components on both sides. The circuit board body 20 fluidically and galvanically separates a wet side W and a dry side D from each other. On the wet side W, the power electronics unit 10 forms a fluidically closed wet space 30 in which a dielectric cooling liquid 100 flows between a cooling-liquid inlet 35 and a cooling-liquid outlet 36 of the wet space 30.

On the wet side W of the circuit board body 20, a plurality of high-voltage power semiconductors 40, 40' are arranged on the circuit board body 20 within the wet space 30 and are directly electrically connected to other electronic components via conductor tracks 22 arranged on the wet side W of the circuit board body 20. The operating voltage of the high-voltage power semiconductors 40, 40' is several 100 V, for example 400 V or 800 V.

Each power semiconductor 40, 40' has a heat sink 80. 82 which brings about heat spreading and an increase in size of the heat-exchanging surface. One heat sink 80 is in the present case a metal heat sink which is provided with a multiplicity of distally protruding cooling fins and is thermally coupled, for example is adhesively bonded, to the power semiconductor 40 in question. The other heat sink 82 is in the present case formed of a plastic potting body 84 which closes off the power semiconductor 40' in question in a fluid-tight manner since the latter is sensitive to liquids. The potting-body heat sink 82 likewise forms distally protruding cooling fins.

An electronic low-voltage circuit 50 is provided on the dry side D which in the present case forms an open dry space 32 which can alternatively also be closed, said low-voltage circuit being operated with an operating voltage of at most 60 V. The low-voltage circuit 50 controls, regulates and monitors the high-voltage circuit 42 formed of the high-voltage power semiconductors 40, 40'. The high-voltage power semiconductors 40, 40' are in particular actuated by the low-voltage circuit 50.

The planar circuit board body 20 is formed of an electrically non-conductive plastic base body 22 in which is embedded, approximately in the center, a copper metal plate 24 which is parallel to both base surfaces, mechanically stabilizes the circuit board body 20, in particular in regard to normal forces, and furthermore brings about extensive heat spreading of the heat generated in the power semiconductors 40, 40'.

The high-voltage power semiconductors 40, 40' are connected to the low-voltage circuit 50 via a potential-separating signal link 60 so as to convey information to said low-voltage circuit. Furthermore, a sensor 70, on the wet-space side, for ascertaining a plurality of physical quantities of the cooling liquid 100 is also connected to the low-voltage circuit 50 via the mentioned signal link so as to convey information in both directions. The sensor 70 ascertains, inter alia, the temperature, the electrical conductivity and the flow rate of the cooling liquid 100.

The signal link 60 is formed of an inductive transceiver element 62 on the wet side W and a corresponding inductive transceiver element 61 on the dry side D. The circuit board body metal plate 24 has in this region an opening 25 which permits the inductive transmission through the circuit board body 20 in this region.

The low-voltage circuit 50 is electrically connected to a controller on board the vehicle via a connector plug 90.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A liquid-cooled power electronics unit, comprising:
   a planar circuit board body having conductor tracks;
   a wet side with a wet space for carrying a dielectric cooling liquid; and
   a fluidically separated dry side, wherein at least two high-voltage power semiconductors are arranged on the circuit board body on the wet side within the wet space, the high-voltage power semiconductors being cooled by the cooling liquid,
   an electronic low-voltage circuit is arranged on the dry side of the circuit board body, and
   the low-voltage circuit and the high-voltage power semiconductors are galvanically separated from each other and a potential-separating signal link is arranged between the low-voltage circuit and the high-voltage power semiconductors.

2. The liquid-cooled power electronics unit as claimed in claim 1, wherein the circuit board body fluidically separates the wet space and the dry side from each other.

3. The liquid-cooled power electronics unit as claimed in claim 1, wherein a heat sink is mounted on distal sides of the high-voltage power semiconductors.

4. The liquid-cooled power electronics unit as claimed in claim 1, wherein the circuit board body comprises plastic and a metal plate is integrated into the plastic of the circuit board body.

5. The liquid-cooled power electronics unit as claimed in claim 1, wherein a sensor for ascertaining a physical quantity of the cooling liquid is arranged on the wet side of the circuit board body, the sensor being connected to the low-voltage circuit so as to convey information to it.

* * * * *